United States Patent
Linder et al.

(10) Patent No.: US 11,126,088 B1
(45) Date of Patent: Sep. 21, 2021

(54) PHOTOPOLYMER DEVELOPMENT RESIN BASE FOR USE WITH THREE-DIMENSIONAL PRINTER

(71) Applicant: Tethon Incorporated, Omaha, NE (US)

(72) Inventors: Karen A. Linder, Omaha, NE (US); James R. Linder, Omaha, NE (US); Gregory C. Pugh, Council Bluffs, IA (US)

(73) Assignee: TETHON INCORPORATED, Omaha, NE (US)

( * ) Notice: Subject to any disclaimer, the term of this patent is extended or adjusted under 35 U.S.C. 154(b) by 304 days.

(21) Appl. No.: 15/960,253

(22) Filed: Apr. 23, 2018

Related U.S. Application Data

(60) Provisional application No. 62/489,033, filed on Apr. 24, 2017.

(51) Int. Cl.
| | |
|---|---|
| C08F 2/46 | (2006.01) |
| C08F 2/50 | (2006.01) |
| C08G 61/04 | (2006.01) |
| G03F 7/20 | (2006.01) |
| G03F 7/00 | (2006.01) |

(52) U.S. Cl.
CPC ........ G03F 7/70416 (2013.01); G03F 7/0037 (2013.01)

(58) Field of Classification Search
CPC ............. C08F 2/50; C08F 2/46; C08G 610/04
USPC ........................ 522/71, 1, 6, 189, 184; 520/1
See application file for complete search history.

(56) References Cited

U.S. PATENT DOCUMENTS

| | | | | |
|---|---|---|---|---|
| 2010/0189941 A1* | 7/2010 | Funakoshi | ................ | B41C 1/05 428/35.8 |
| 2014/0234774 A1* | 8/2014 | Cho | ........................ | G03F 7/029 430/281.1 |
| 2015/0159032 A1* | 6/2015 | Yofu | ...................... | C09D 11/40 347/20 |

OTHER PUBLICATIONS

BASF, Photoinitiators, Apr. 5, 2016, https://www.dispersions-pigments.basf.com/portal/basf/ien/dt.jsp?setCursor=1_556340 (Year: 2016).*
Wayback maching, 2020, BASF Photoinitiator creation date (Year: 2020).*

* cited by examiner

*Primary Examiner* — Jessica Whiteley
(74) *Attorney, Agent, or Firm* — Kevin E. West; Advent, LLP

(57) ABSTRACT

A photopolymer development resin base is available for use with additive manufacturing units (for example, various three-dimensional printers) to create three-dimensional (3D) printed structures. In some embodiments, the resin formula can include a monomer, oligomer, diluent, photo initiator, deflocculents, wetting agents, and dispersants, with a limit on any photo-blockers, if present at all. The photopolymer development resin base functions as a binder precursor material with the capacity to accept solid powders or liquids for UV printing, which is not configured to print "as is."

12 Claims, 2 Drawing Sheets

PHOTOPOLYMER DEVELOPMENT RESIN BASE FOR USE WITH THREE-DIMENSIONAL PRINTER

RELATED APPLICATIONS

Figure 1:
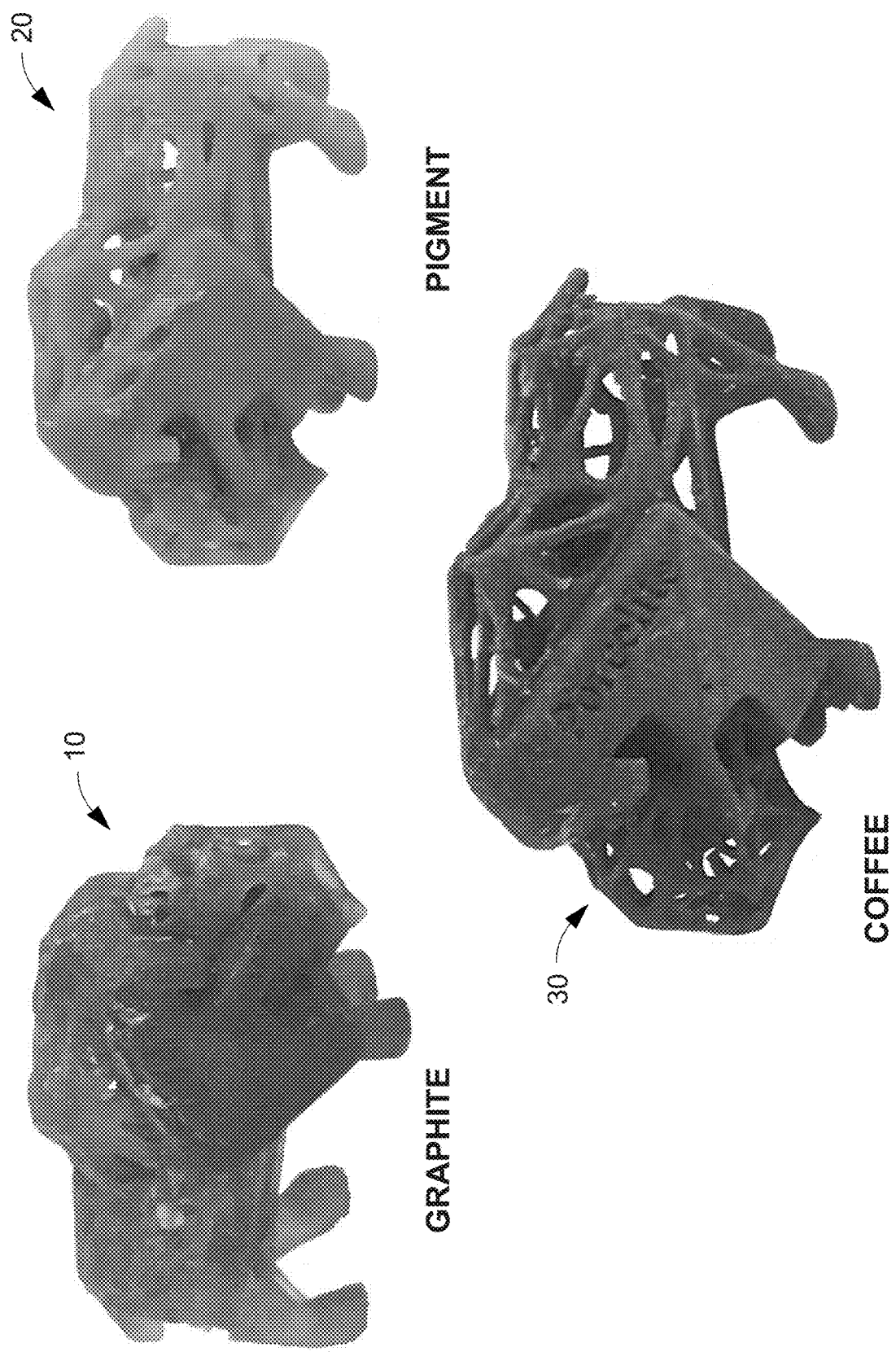

This application claims domestic priority to U.S. Provisional Application No. 62/489,033, filed Apr. 24, 2017, entitled "PHOTOPOLYMER DEVELOPMENT RESIN BASE FOR USE WITH THREE-DIMENSIONAL PRINTER," the contents of which are hereby incorporated by reference thereto. This application is further related to the following U.S. Non-Provisional Application, concurrently filed herewith: U.S. application Ser. No. 15/960,269, entitled "THREE-DIMENSIONAL PRINTED OBJECTS WITH OPTIMIZED PARTICLES FOR SINTERING AND CONTROLLED POROSITY," the contents of which are hereby incorporated by reference thereto.

BACKGROUND

Additive manufacturing (e.g., three-dimensional (3D) printing) techniques are available that facilitate printing any of a variety of three-dimensional shapes, including complex shapes not readily produced by other means. Such techniques can use photo-curable resins (e.g., curable with ultraviolet (UV) light (e.g., 10 to 405 nanometer (nm) wavelengths)) as the base formative material for a given part. For example, the UV printing method may be one of stereolithography (SLA) printing, digital light processing (DLP) printing, or Continuous Liquid Interface Production (CLIP; originally Continuous Liquid Interphase Printing). Any such UV printing method relies on photocuring (i.e., photoinduced hardening of a monomeric, oligomeric, or polymeric substrate, normally using ultraviolet (UV) light) of the photo-curable resin and may incorporate one or more photo-initiators and/or one or more photo-blockers to promote the photocuring process. A basic resin formula includes a monomer, an oligomer, a diluent, a dispersant, a photo initiator, and a photo-blocker (e.g., a chemical additive configured to block and/or absorb light).

DRAWINGS

The detailed description is described with reference to the accompanying figure. The use of the same reference numbers in different instances in the description and the figures may indicate similar or identical items. Various embodiments or examples ("examples") of the present disclosure are disclosed in the following detailed description and the accompanying drawing. The drawing is not necessarily to scale. In general, operations of disclosed processes may be performed in an arbitrary order, unless otherwise provided in the claims.

FIG. 1 is a side, isometric, photographic view illustrating three comparative embodiments of structures printed using the present photopolymer development resin base, in accordance with an example implementation of the present disclosure.

Figure 2:
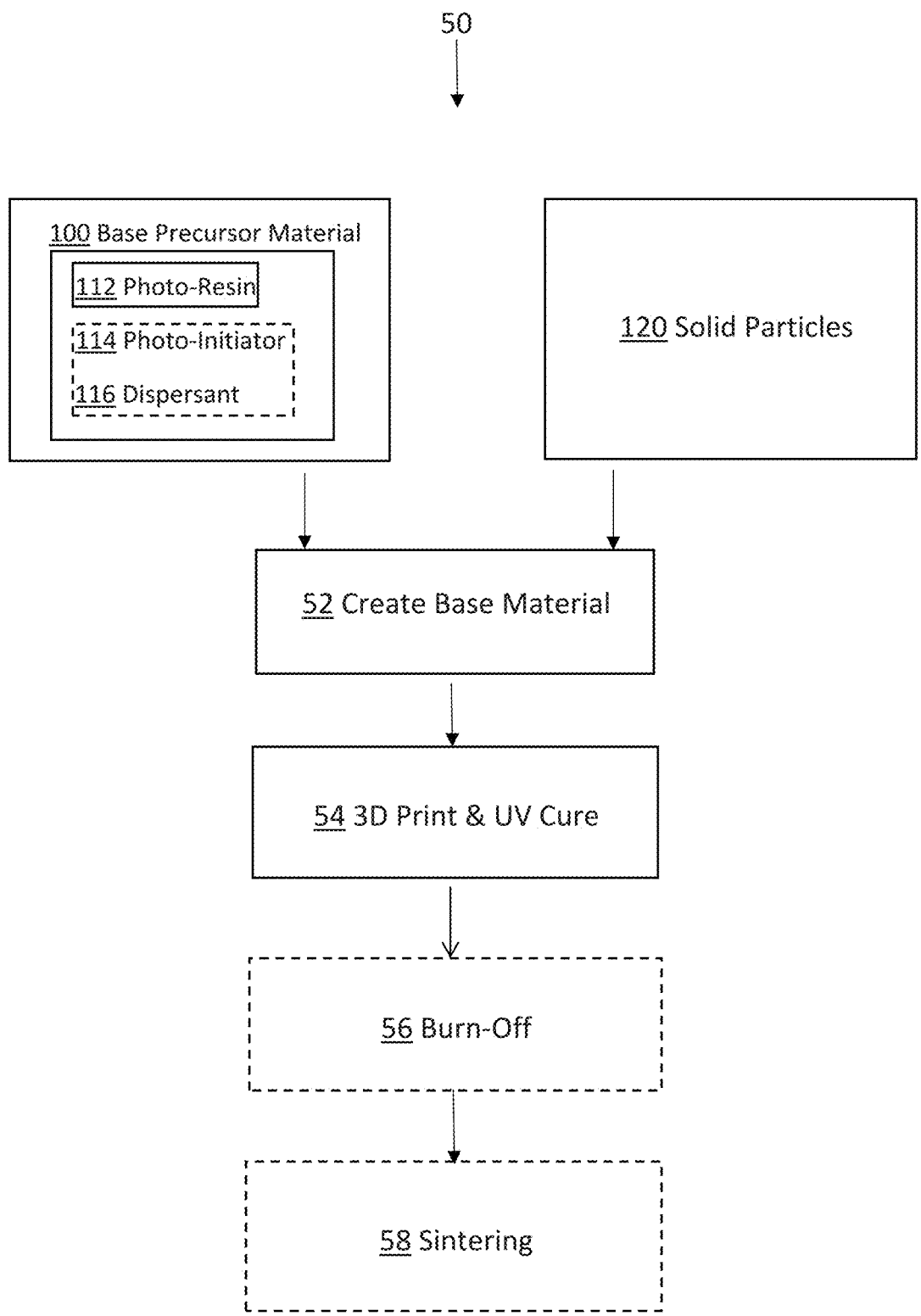

FIG. 2 provides a flow chart of a printing-based method for forming a structure using a precursor resin base, in accordance with an example implementation of the present disclosure.

DETAILED DESCRIPTION

Overview

A photopolymer development resin base for use with additive manufacturing units (for example, SLA, DLP, and/or CLIP 3D printers) to create three-dimensional (3D) printed structures is described in accordance with an embodiment of the present disclosure. In some embodiments, the resin formula can include a monomer, oligomer, diluent, photo initiator, dispersants, deflocculants, and/or rheology additives, with a limit on any photo-blockers (i.e., photo-absorbers), if present at all. This base resin can have the capacity to accept the addition of solid powders or other liquids. The printed structure manufactured using the base resin can be in its final form upon curing of the photocurable resin or may further require sintering. The photopolymer development resin base can be used in the development of any of a range of UV curing resin materials for 3D printing. Since the photopolymer development resin may be combined with any of a range of solid powders or liquids to yield a varying array of products, applications for the base precursor fluid may exist in a variety of industries such as automotive, dentistry, jewelry, biotech, electronics, and mechanical manufacture, among others.

It is important to note that the present photopolymer development resin base is essentially a binder precursor material for UV printing, as the binder (e.g., resin materials which bind the structure together) precursor material is not necessarily configured to print "as is." The precursor material or resin base relies on the ability of solid material to block and/or absorb light. The ability to block and/or absorb a certain amount of light helps retain a portion of the light/electromagnetic radiation within the structure being cured and thus use that retained radiation for curing of the resin. Without any such blockage or absorption, light may be transmitted through the structure without enough of it remaining in the structure to enact sufficient curing levels.

3D printing resins typically may have one or more photo-blockers (e.g., 0.4-0.6% by weight of the resin base) included therein to localize the curing when the resin is exposed to UV light. In embodiments, photo-blockers or photo-absorbers are chemically configured to absorb photonic energy (e.g., one or more wavelengths of electromagnetic radiation, such as UV light) and thus may stop or retard the curing of a resin. In embodiments, UV stabilizers, zinc oxide dispersions, optical whiteners, and/or optical brighteners, each having the ability to absorb UV light, may be used as a photo-blocker. Instead, the present binder precursor material or resin base is configured to be combined with solid powders, with the resin base-powder combination being used to act as a 3D print resin. Such solid powders can physically block or retard light transmission through, for example, opacity (e.g., light generally does not penetrate object—often dark colored materials), reflectance, and/or particle build-up. In some embodiments, a translucent material (e.g., silica) can at least retard light transmission. For example, the solid particles may interfere with the curing (i.e., effectively block or reduce photo-curing) when the load percentage increases past where light can no longer pass through the particles, and/or when the material (e.g., tin, zinc, titanium) absorbs/reflects the same spectrum of light that is being used to cure the resin.

Employing solid powders that physically block or retard light transmission through, e.g., opacity, translucence, or reflectance as a primary photo-interference material can have important repercussions on the overall material to be printed. Some materials can absorb and/or interfere with a significant amount of light and thus limit how much of such a solid material can be added to a resin base. When loading solid materials into a resin that already contains a designated photo-blocker, there may be a limit to how much powder can be loaded in before the part can no longer cure when exposed to UV light (e.g., a sufficient amount of radiation may not reach all portions of the part to effect adequate curing after a certain limit is reached). Eliminating or curtailing the amount of photo-blocker(s) can increase the chance of optimal loading occurring (e.g., avoid potential "over-blocking" effects from employing both a standard level of photo-blocker and a high-solids content). As such, in some embodiments, no additional photo-blockers are added, relying on the solids to be added to the resin mixture for their inherent photo-blocking and/or photo-interference capabilities. In some embodiments, the added solids may first be dissolved or suspended as part of a liquid carrier (e.g., ground coffee as part of a coffee drink; pigment(s) in paint), with that liquid carrier then being mixed with the resin mixture. In some embodiments, the liquid to be added may itself serve as a photo-interference agent (e.g., the liquid may not necessarily have a have a dissolved and/or a suspended solids content yet still be able to interfere with light and/or electromagnetic radiation transmission). In some embodiments, the liquid additive and/or a derivative thereof can serve a long-term purpose (e.g., colorant), beyond acting as a photo-interference agent. So long the liquid can display the desired photo-interference capabilities (e.g., with or without any associated solids), the use of such a liquid additive as a photo-interference agent is considered to be within the scope of the present disclosure.

Not all solid materials (e.g., silica, particularly in higher concentrations), however, may block (e.g., interfere with) enough light to yield, upon curing, crisp details in a printed object. Thus, in some embodiments, some photo blockers may be added into the resin base to enhance details of the printed object. For example, in those situations, a reduced amount of 0.01%-0.1% (by weight) of a photo-blocker may be used with the solids (e.g., reduced by a factor of four or more compared to a standard printing resin). In some embodiments, the photo-blocker or photo-absorber can include one or more of 2-ethyl-9,10-dimethoxy anthracene (EDMA) or 1,4-bis (2-dimethylstyryl) benzene (BMSB) or 2,2'-(2,5-thiophenediyl)bis(5-tert-butylbenzoxazole). In embodiments, a light absorber aids in reducing penetration depth ($D_p$) of light. Lowering $D_p$ can allow thinner layers, better resolution, and/or in-cut structures otherwise not possible. (See https://pubs.acs.org/doi/full/10.1021/acs.chemrev.7b00074 (Section 2.2.6).).

In some embodiments, the resin base serves as a binder precursor fluid (e.g., the resin includes all the base material ingredients except for any solid powder to be added). The binder precursor fluid, in some embodiments, includes 3-5% (by weight) photo-initiator, 0.9-1% (by weight) dispersant, and resin as the remainder. The resin may be a photo-curable resin and, in some embodiments, can be an ultraviolet (UV) curable resin. In some embodiments, the photo-curable resin may, by way of example only, be a mercaptan-modified polyether acrylate that can be readily cured with UV LED, UVA or low energy UV lamps; a cyclic mono-functional acrylate with excellent adhesion characteristics; a difunctional acrylate that imparts good adhesion, hardness and toughness to UV/EB-cured formulations; and/or other UV-curable acrylates and vinyl-ester resins.

In some embodiments, the dispersant may be added at a level between 0.25-15% by weight. The dispersant, per the latter example, may be a hydrophilic fumed silica. The photo-initiator can aid in promoting the curing of the resin upon exposure thereof to ultraviolet (UV) light, and the dispersant can help the mixture to sufficiently gel (e.g., enough to promote suspension but not be so viscous as to interfere with printing) and keep the solid materials suspended in the base material until printed or otherwise formed. The following compounds are given as examples of such photo-initiators: acetophenone, anthraquinone, 1-(4-isopropylphenyl)-2-hydroxy-2-methylpropan-1-one, carbazole, xanthone, 4-chlorobenzophenone, 4,4'-diaminobenzophenone, 1,1-dimethoxydeoxybenzoin, benzyl methyl ketal, 3,3'-dimethyl-4-methoxybenzophenone, and thioxanethone compounds. The resin base may further include a diluent. In some embodiments, the diluent can include, by way of example, one or more of an acrylic acid ester, a monofunctional urethane acrylate, DPGDA (Dipropylene Glycol Diacrylate), DPHA (Dipentaerythritol Penta/Hexa Acrylate), a low odor monofunctional acrylated aliphatic epoxy, or a cyclic aliphatic diacrylate.

The solids can act as a photo-blocker or photo-interference agent for the 3D-printed structure, facilitating the curing of the photopolymer resin within the resin base. In embodiments, the solids (e.g., filler powder and/or elongate particles) can provide at least one additional (e.g., long-term) property (e.g., textural, mechanical, electrical, thermal, visual, gas-venting) in the formed component, beyond a short-term light-blocking property. The binder precursor fluid (i.e., the resin base) can be combined with the solids (e.g., sinterable powder; decorative powder; property-enhancing powder; and/or the elongate particles) later, prior to a forming and curing step. Adding the solids later (e.g., at the manufacturing site) can facilitate shipping of the resin mixture.

In some embodiments, the amount of photo initiator may be increased up to, for example, 3-5% (by weight) to improve the photo reaction in the solution. By including a larger amount of the photo-initiator, a larger amount of powder can be loaded into the resin mixture. However, it is to be understood that, if the material being loaded absorbs and/or interferes (e.g., via opacity and/or reflectance) with light, then it may not be possible to continue to add more photo-initiator to compensate for an even greater amount of a light-interfering powder. In some embodiments, the benefit of the photo-initiator may reach a maximum benefit at a level of 3% by weight.

The present base resin serves as a universal resin that allows for the addition of a wide range of solid materials for 3D printing. This base resin material is not necessarily configured for making a 3D object on its own. Instead, solid powders and/or an amount of a photo-blocker can be added to it prior to a 3D printing stage to absorb, block, or otherwise interfere with the light (e.g., UV light) so the material can properly cure upon forming.

Example Implementations

FIG. 1 illustrates three comparative structures 10, 20, 30 (all generally in a form of an American Bison), printed using the present photopolymer development resin base. Structure 10 incorporates graphite as the added solid powder; structure 20 uses a pigment (e.g., pink colorant) as the added solid powder; and structure 30 employs coffee as the added liquid (which carries the dissolved and/or suspended coffee therein). The respective additive powder (e.g., whether added alone or with a liquid carrier) in structures 10, 20, 30 served as a photo-blocker and/or a photo-interference agent during a corresponding curing phase for each.

FIG. 2 illustrates a printing-based process 50 for forming a structure using a precursor resin base as described herein, in accordance with an embodiment of the present disclosure. The printing-based method 50 generally includes the steps of creating a base material (step 52); and 3D printing (e.g., encompassing any known additive manufacturing procedure) and UV curing a printed structure (e.g., printing and curing, layer-by-layer; printing an object and post-curing) (step 54). If it is desired to form a sintered (e.g., a fired and/or densified) structure, additional steps of performing a burn-off (e.g., burning-off any organics; driving off any water, including water bound to any component materials) (step 56); and sintering the materials remaining after burn-off (step 58) can be performed. Sinterable powders may be included in the resin at step 52, for use in ultimately creating a sintered structure. The sinterable materials can, for example, be metals, ceramics, or some combination thereof. In some embodiments, the sinterable ceramic powder may, at least in part, form a glass phase during firing. In some embodiments, plastic materials may be candidates for sintering. The sintering process employed may be a solid-state sintering process or a liquid-phase sintering process, as appropriate, based on material(s) and/or processing parameters chosen. If the structure to be formed is not to be fired, powders and/or liquids other than sinterable powders can be added.

The first step 52 of creating the base material can involve mixing of a base precursor material 100 and a plurality of solid particles 120, which may include solid powders and, in some embodiments, may incorporate additional solid particles not in powder form (e.g., elongate particles that promote venting and thereby aid in porosity control). The base precursor material 100 can include a photo-resin 112 (e.g., a UV-curable resin) and may further include a photo-initiator 114 and/or a dispersant 116, with at most 0.1% (by weight) of a photo-blocker. In some embodiments, the precursor material 100 (e.g., mainly resin) makes up 45-55% (by weight) of the base material, with the remainder being solid particles 120 (e.g., powder and/or elongated particles). In some other embodiments, the base material contains up to 90% (by weight) binder precursor material 100. The amount of binder precursor material 100 (which may be in a fluid form) to be used can be chosen based on one or more factors. Examples of such factors are the desired level of fluid flow during printing (e.g., motivation to increase its amount); the amount, if any, to be burned off later (e.g., motivation to minimize the fluid amount); the ratio of solids to the binder precursor fluid needed to achieve an appropriate level of photo-blocking (e.g., motivation to decrease the fluid amount); and/or the amount needed to get the desired level of green-state bonding (e.g., motivation to increase the fluid amount).

The solid particles 120 can include, for example, sinterable powders (e.g., ceramic powders, metallic powders, or combinations thereof); elongate particles (e.g., acicular crystals, whiskers, tubular particles), e.g., for aiding with outgassing during a burn-off stage and/or improving the mechanical properties; colorants; and/or property-enhancing (e.g., textural, electrical, or mechanical) materials. In some embodiments, the powders (e.g., primary and/or secondary) can be a range of sizes (e.g., to promote more efficient initial packing thereof and/or to facilitate mixing in the resin matrix), and in some embodiments, the powders can be size 300 mesh (i.e., able to pass through a screen with 300 openings per inch) or smaller, or, more particularly, in a range of 300-375 mesh. In some embodiments, the powder may be larger than 400 mesh in size (e.g., 300-375 mesh) to avoid forming a gel, which can otherwise make printing and/or other forming processes difficult. In some embodiments, the powders may be nanoparticles with or without coatings, ranging in size from 1 to 100 nanometers. It is to be understood that, in some embodiments, the added solid particles or liquids (e.g., beyond the base resin) may serve as colorants and/or property-enhancing materials.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A resin base material, the resin base material being a binder precursor material for an additive manufacturing process, the resin base material comprising:
    a photo-curable resin; and
    a photo-initiator configured to promote a curing of the photo-curable resin upon exposure to photonic energy;
    wherein the resin base material contains no more than 0.1% by weight of a photo-blocker, the photo-blocker being a photo-blocking chemical configured to absorb photonic energy, the resin base material requiring a filler powder to be added thereto as a photo-interference agent in order for the resin base to be successfully used in an additive manufacturing process, the photo-interference agent capable of physically retarding light transmission, the resin base material not being photo-curable until the filler powder is added thereto.

2. The resin base material of claim 1, wherein the photo-initiator comprises 3-5% by weight of the resin base material.

3. The resin base material of claim 1, further including a dispersant, the dispersant comprising 0.25-2% by weight of the resin base material.

4. The resin base material of claim 1, wherein the resin base material is initially free of any photo-blocker.

5. The resin base material of claim 1, wherein the resin base material is not configured for three-dimensional printing in an initial form thereof.

6. The resin base material of claim 1, further comprising at least one of a diluent, a dispersant, a deflocculent, or a wetting agent.

7. A resin base material, the resin base material being a binder precursor material for an additive manufacturing process, comprising:
    a photo-curable resin; and
    a photo-initiator configured to promote a curing of the photo-curable resin upon exposure to photonic energy;
    wherein the resin base material contains no more than 0.1% by weight of a photo-blocker, the photo-blocker being a photo-blocking chemical, the resin base material being able to be photo-cured only upon having at least one of a photo-interference agent or a yet further amount of a photo-blocker added thereto, the photo-interference agent comprising at least one of a solid or a liquid capable of physically retarding light transmission, the resin base material not being photo-curable until the at least one of the photo-interference agent or the yet further amount of a photo-blocker is added thereto.

8. The resin base material of claim 7, further comprising a photo-interference agent, the photo-interference agent configured to serve a long-term function in addition to acting as a photo-interference agent.

9. The resin base material of claim 7, further comprising a photo-interfering solid material as the photo-interference agent, the photo-interfering solid material being at least one of opaque, reflective, or translucent.

10. The resin base material of claim 9, wherein the photo-interfering solid material includes at least one of a sinterable powder; a decorative powder; a property-enhancing powder; or a plurality of elongate particles.

11. The resin base material of claim 10, wherein the photo-interfering solid material includes a sinterable powder, the sinterable powder comprising at least one of a metal, a ceramic, or a polymer.

12. The resin base material of claim 7, wherein the photo-initiator is present in an amount of up to 5% by weight.

\* \* \* \* \*